(12) United States Patent
Freer et al.

(10) Patent No.: US 8,316,866 B2
(45) Date of Patent: Nov. 27, 2012

(54) METHOD AND APPARATUS FOR CLEANING A SEMICONDUCTOR SUBSTRATE

(75) Inventors: Erik M. Freer, Campbell, CA (US); John M. deLarios, Palo Alto, CA (US); Katrina Mikhaylichenko, San Jose, CA (US); Michael Ravkin, Sunnyvale, CA (US); Mikhail Korolik, San Jose, CA (US); Fred C. Redeker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 239 days.

(21) Appl. No.: 11/612,352

(22) Filed: Dec. 18, 2006

(65) Prior Publication Data

US 2007/0084483 A1    Apr. 19, 2007

Related U.S. Application Data

(63) Continuation-in-part of application No. 10/608,871, filed on Jun. 27, 2003, now abandoned.

(60) Provisional application No. 60/755,377, filed on Dec. 30, 2005.

(51) Int. Cl.
*B08B 3/00* (2006.01)

(52) U.S. Cl. ............... 134/60; 137/268; 510/445

(58) Field of Classification Search .......... None
See application file for complete search history.

(56) References Cited

U.S. PATENT DOCUMENTS

| | | | |
|---|---|---|---|
| 3,037,887 A | 6/1962 | Brenner et al. | 134/22 |
| 3,212,762 A | 10/1965 | Carroll et al. | 261/124 |
| 3,436,262 A | 4/1969 | Crowe et al. | 134/10 |
| 3,617,095 A | 11/1971 | Lissant | 406/197 |
| 3,978,176 A | 8/1976 | Voegeli | 261/122 |
| 4,085,059 A | 4/1978 | Smith et al. | 134/26 |
| 4,133,773 A | 1/1979 | Simmons | 261/21 |
| 4,156,619 A | 5/1979 | Griesshammer | 134/2 |
| 4,238,244 A | 12/1980 | Banks | 134/22 |
| 4,781,764 A | 11/1988 | Leenaars | 134/34 |
| 4,817,652 A | 4/1989 | Liu et al. | 134/102 |
| 4,838,289 A | 6/1989 | Kottman et al. | 134/153 |
| 4,849,027 A | 7/1989 | Simmons | 134/22 |

(Continued)

FOREIGN PATENT DOCUMENTS

DE    40-38-587    6/1992

(Continued)

OTHER PUBLICATIONS

Aubert, JM et al.; "Aqueous foams"; Scientific America; 1986, 74-82, 254.

(Continued)

*Primary Examiner* — Eric Golightly
(74) *Attorney, Agent, or Firm* — Martine Penilla Group, LLP.

(57) ABSTRACT

A method for cleaning a substrate is provided. The method initiates with applying an activation solution to a surface of the substrate. The activation solution and the surface of the substrate are contacted with a surface of a solid cleaning surface. The activation solution is absorbed into a portion of the solid cleaning element and then the substrate or the solid cleaning surface is moved relative to each other to clean the surface of the substrate. A method for cleaning the surface of the substrate with a solid cleaning element that experiences plastic deformation is also provided. Corresponding cleaning apparatuses are also provided.

13 Claims, 7 Drawing Sheets

U.S. PATENT DOCUMENTS

| | | | |
|---|---|---|---|
| 4,911,761 A | 3/1990 | McConnell et al. | 134/11 |
| 4,962,776 A | 10/1990 | Liu et al. | 134/11 |
| 5,000,795 A | 3/1991 | Chung et al. | 134/37 |
| 5,048,549 A | 9/1991 | Hethcoat | 134/122 R |
| 5,102,777 A | 4/1992 | Lin et al. | 430/441 |
| 5,105,556 A | 4/1992 | Kurokawa et al. | 34/12 |
| 5,113,597 A | 5/1992 | Sylla | 34/22 |
| 5,175,124 A | 12/1992 | Winebarger | 437/180 |
| 5,181,985 A | 1/1993 | Lampert et al. | 156/635 |
| 5,226,969 A | 7/1993 | Watanabe et al. | 134/7 |
| 5,242,669 A | 9/1993 | Flor | 423/465 |
| 5,271,774 A | 12/1993 | Leenaars et al. | 134/31 |
| 5,288,332 A | 2/1994 | Pustilnik et al. | 134/27 |
| 5,306,350 A | 4/1994 | Hoy et al. | 134/22.14 |
| 5,336,371 A | 8/1994 | Chung et al. | 156/659.1 |
| 5,415,191 A | 5/1995 | Mashimo et al. | 134/102.1 |
| 5,417,768 A | 5/1995 | Smith et al. | 134/10 |
| 5,464,480 A | 11/1995 | Matthews | 134/1.3 |
| 5,472,502 A | 12/1995 | Batchelder | 118/52 |
| 5,494,526 A | 2/1996 | Paranjpe | 134/1 |
| 5,498,293 A | 3/1996 | Ilardi et al. | 134/3 |
| 5,656,097 A | 8/1997 | Olesen et al. | 134/1 |
| 5,660,642 A | 8/1997 | Britten | 134/30 |
| 5,674,831 A | 10/1997 | Schulz et al. | |
| 5,705,223 A | 1/1998 | Bunkofske | 427/240 |
| 5,800,626 A | 9/1998 | Cohen et al. | 134/1.3 |
| 5,858,283 A | 1/1999 | Burris | 261/122.1 |
| 5,900,191 A | 5/1999 | Gray et al. | 261/59 |
| 5,904,156 A | 5/1999 | Advocate, Jr. et al. | 134/2 |
| 5,908,509 A | 6/1999 | Olesen et al. | 134/1.3 |
| 5,911,837 A | 6/1999 | Matthews | 134/2 |
| 5,932,493 A | 8/1999 | Akatsu et al. | 438/745 |
| 5,944,581 A | 8/1999 | Goenka | 431/39 |
| 5,944,582 A | 8/1999 | Talieh | 451/41 |
| 5,945,351 A | 8/1999 | Mathuni | 438/706 |
| 5,951,779 A | 9/1999 | Koyanagi et al. | 134/2 |
| 5,964,954 A | 10/1999 | Matsukawa et al. | 134/6 |
| 5,964,958 A | 10/1999 | Ferrell et al. | 134/26 |
| 5,968,285 A | 10/1999 | Ferrell et al. | 134/26 |
| 5,997,653 A | 12/1999 | Yamasaka | 134/2 |
| 6,048,409 A | 4/2000 | Kanno et al. | 134/34 |
| 6,049,996 A | 4/2000 | Freeman et al. | 34/362 |
| 6,081,650 A | 6/2000 | Lyons et al. | 386/95 |
| 6,090,217 A | 7/2000 | Kittle | 134/11 |
| 6,092,538 A | 7/2000 | Arai et al. | 134/1.3 |
| 6,152,805 A | 11/2000 | Takahashi | 451/36 |
| 6,158,445 A | 12/2000 | Olesen et al. | 134/1.3 |
| 6,167,583 B1 | 1/2001 | Miyashita et al. | 15/77 |
| 6,228,563 B1 | 5/2001 | Starov et al. | 430/327 |
| 6,267,125 B1 | 7/2001 | Bergman et al. | 134/102.1 |
| 6,270,584 B1 | 8/2001 | Ferrell et al. | 134/26 |
| 6,272,712 B1 | 8/2001 | Gockel et al. | 15/77 |
| 6,276,459 B1 | 8/2001 | Herrick et al. | 169/14 |
| 6,286,231 B1 | 9/2001 | Bergman et al. | 34/410 |
| 6,290,780 B1 | 9/2001 | Ravkin | 134/6 |
| 6,296,715 B1 | 10/2001 | Kittle | 134/2 |
| 6,319,801 B1 | 11/2001 | Wake et al. | 438/585 |
| 6,352,082 B1 | 3/2002 | Mohindra et al. | 134/25.4 |
| 6,386,956 B1 | 5/2002 | Sato et al. | 451/41 |
| 6,398,975 B1 | 6/2002 | Mertens et al. | 216/92 |
| 6,401,734 B1 | 6/2002 | Morita et al. | 134/153 |
| 6,423,148 B1 | 7/2002 | Aoki | 134/3 |
| 6,439,247 B1 | 8/2002 | Kittle | 134/102.1 |
| 6,457,199 B1 | 10/2002 | Frost et al. | 15/77 |
| 6,467,897 B1* | 10/2002 | Wu et al. | 347/102 |
| 6,491,043 B2 | 12/2002 | Mohindra et al. | 134/25.4 |
| 6,491,764 B2 | 12/2002 | Mertens et al. | 134/36 |
| 6,493,902 B2 | 12/2002 | Lin | 15/302 |
| 6,513,538 B2 | 2/2003 | Chung et al. | 134/1.2 |
| 6,514,921 B1 | 2/2003 | Kakizawa | 510/175 |
| 6,527,870 B2 | 3/2003 | Gotikis | 134/6 |
| 6,532,976 B1 | 3/2003 | Huh et al. | 134/111 |
| 6,537,915 B2 | 3/2003 | Moore et al. | 438/692 |
| 6,562,726 B1 | 5/2003 | Torek et al. | 438/745 |
| 6,576,066 B1 | 6/2003 | Namatsu | 134/30 |
| 6,594,847 B1 | 7/2003 | Krusell et al. | 15/102 |
| 6,602,111 B1* | 8/2003 | Fujie et al. | 451/36 |
| 6,616,772 B2 | 9/2003 | de Larios et al. | 134/21 |
| 6,733,596 B1 | 5/2004 | Mikhaylichenko et al. | 134/6 |
| 6,787,473 B2 | 9/2004 | Andreas | 438/692 |
| 6,797,071 B2 | 9/2004 | Kittle | 134/11 |
| 6,802,911 B2 | 10/2004 | Lee et al. | 134/28 |
| 6,846,380 B2 | 1/2005 | Dickinson et al. | 156/354.31 |
| 6,851,435 B2 | 2/2005 | Mertens et al. | 134/99.1 |
| 6,874,516 B2 | 4/2005 | Matsuno et al. | 134/148 |
| 6,896,826 B2 | 5/2005 | Wojtczak et al. | 252/79.1 |
| 6,927,176 B2 | 8/2005 | Verhaverbeke et al. | 438/745 |
| 6,946,396 B2 | 9/2005 | Miyazawa et al. | 438/689 |
| 6,951,042 B1 | 10/2005 | Mikhaylichenko et al. | 15/77 |
| 7,122,126 B1 | 10/2006 | Fuentes | 216/689 |
| 2001/0037818 A1* | 11/2001 | Harano et al. | 134/7 |
| 2002/0072482 A1 | 6/2002 | Sachdev et al. | 510/175 |
| 2002/0094684 A1 | 7/2002 | Hirasaki et al. | 438/689 |
| 2002/0121290 A1 | 9/2002 | Tang et al. | 134/6 |
| 2002/0160608 A1 | 10/2002 | Hirabayashi et al. | |
| 2002/0185164 A1 | 12/2002 | Tetsuka et al. | 134/148 |
| 2002/0195121 A1 | 12/2002 | Kittle | 134/3 |
| 2003/0075204 A1 | 4/2003 | de Larios et al. | 134/21 |
| 2003/0148903 A1 | 8/2003 | Bargaje et al. | 510/130 |
| 2003/0171239 A1 | 9/2003 | Patel et al. | 510/406 |
| 2003/0226577 A1 | 12/2003 | Orll et al. | 134/1.3 |
| 2004/0002430 A1 | 1/2004 | Verhaverbeke | 510/175 |
| 2004/0053808 A1 | 3/2004 | Raehse et al. | 510/447 |
| 2004/0065352 A1 | 4/2004 | Yonekura et al. | |
| 2004/0099290 A1 | 5/2004 | Morinaga et al. | |
| 2004/0134515 A1 | 7/2004 | Castrucci | 134/2 |
| 2004/0159335 A1 | 8/2004 | Montierth et al. | 134/10 |
| 2004/0163681 A1 | 8/2004 | Verhaverbeke | 134/28 |
| 2004/0223166 A1 | 11/2004 | Kimba et al. | |
| 2004/0261823 A1 | 12/2004 | de Larios | 134/31 |
| 2005/0045209 A1 | 3/2005 | Tan | 134/18 |
| 2005/0132515 A1 | 6/2005 | Boyd et al. | 15/77 |
| 2005/0133060 A1 | 6/2005 | Larios et al. | 134/1.3 |
| 2005/0133061 A1 | 6/2005 | de Larios et al. | 134/6 |
| 2005/0159322 A1 | 7/2005 | Min et al. | 510/175 |
| 2005/0176606 A1 | 8/2005 | Konno et al. | 510/175 |
| 2005/0183740 A1 | 8/2005 | Fulton et al. | 134/3 |
| 2006/0201267 A1 | 9/2006 | Liu | 74/89.2 |
| 2006/0283486 A1 | 12/2006 | de Larios et al. | 134/34 |
| 2006/0285930 A1 | 12/2006 | de Larios et al. | 406/197 |
| 2007/0000518 A1 | 1/2007 | Korolik et al. | |
| 2007/0084483 A1* | 4/2007 | Freer et al. | 134/6 |

FOREIGN PATENT DOCUMENTS

| | | |
|---|---|---|
| EP | 0827188 | 3/1998 |
| EP | 0905746 | 3/1999 |
| EP | 11-334874 | 12/1999 |
| EP | 0989600 | 3/2000 |
| JP | 53-076559 | 7/1978 |
| JP | 56-084618 | 7/1981 |
| JP | 56-084619 | 7/1981 |
| JP | 59-24849 | 2/1984 |
| JP | 60-005529 | 1/1985 |
| JP | 62-119543 | 5/1987 |
| JP | 63-077510 | 4/1988 |
| JP | 02-309638 A | 12/1990 |
| JP | 5-15857 | 1/1993 |
| JP | 06-177101 | 6/1994 |
| JP | 07-006993 | 1/1995 |
| JP | 11-350169 | 12/1999 |
| JP | 2001-064688 | 3/2001 |
| JP | 2002-66475 | 3/2002 |
| JP | 2002-280330 | 9/2002 |
| JP | 2002-309638 | 10/2002 |
| JP | 2003-282513 | 10/2003 |
| JP | 2005-194294 | 7/2005 |
| WO | WO-99/16109 | 4/1999 |
| WO | WO-00/33980 | 6/2000 |
| WO | WO-00/59006 | 10/2000 |
| WO | WO-01/12384 | 2/2001 |
| WO | WO-02/101795 | 12/2002 |
| WO | WO-2005/006424 | 1/2005 |
| WO | WO 2005/064647 | 7/2005 |

OTHER PUBLICATIONS

Kittle, et al.; "Semiconductor Wafer Cleaning and Drying Using a Foam Medium"; <hhttp://www.aquafoam.com/papers;SCI0202.pdf>; Sematech Novel Wafer Cleans Working Group Meeting, Internet Presetation; Nov. 13, 2001.

Hunter; "Introduction to Modern Colloid Science"; Oxford University Press; Feb. 1, 1994.

Lester; "Is Foam 'Wafer Cleaning and Drying the Future?" <http://www.aquafoam.com/papers/SCI0202.pdf>; Semiconductor International 25, #2; Feb. 1, 2002.

Kirkpatrick et al.; "Advanced Wafer-Cleaning Evolution"; Solid State Technology; May 1, 2003; www.solid-state.com.

Weaire et al.; "The Physics of Foams"; Department of Physics; Trinity Collelge, Dublin; 1999.

Kittle, et al.; "Photoreisist Removal Using Aqueous Foam"; Internet; http://www.aquafoam.com/paper/SCCPresentation.pdf.

Kittle, et al.; "Aqueous Foam Drying and Cleaning of Semiconductor Wafers"; Internet; http://www.aquafoam.com/paper/SCCPresentation.pdf.

Kittle, et al.; "Foam Wafer Cleaning—Experimental Proof of Concept"; Internet; http://www.aquafoam.com/paper/Removalall.pdf.

Kittle, et al.; "Particulate Removal Using a Foam Medium"; Internet; http://www.aquafoam.com/paper/particulate.pdf.

Kittle, et al. "Removing Particles with a Foam Medium" Internet http://www.aquafoam.com/paper/A2C2foamedium.pdf.

Kittle, et al.; "Photoresist Residue Removal Using Aqueous Foam Proof of Concept Experiments"; Internet; http://www.aquafoam.com/paper/Proof-11MB.pdf;<papers/A2C2photoresist.pdf>; 13-17; May 1, 2002.

Lide; "Air Composition"; CRC handbook of Chemistry and Physics; 1997.

U.S. Appl. No. 11/639,752, filed Dec. 15, 2006, Boyd et al.

U.S. Appl. No. 11/743,283, filed May 2, 2007, Freer et al.

\* cited by examiner

METHOD AND APPARATUS FOR CLEANING A SEMICONDUCTOR SUBSTRATE

CROSS REFERENCE To RELATED APPLICATIONS

This application claims the benefit of U.S. Provisional Application No. 60/755,377, filed Dec. 30, 2005. Additionally, this application is a continuation-in-part of prior application Ser. No. 10/608,871, filed Jun. 27, 2003, now abandoned and entitled "Method and Apparatus for Removing a Target Layer From a Substrate Using Reactive Gases." The disclosure of each of the above-identified applications is incorporated herein by reference for all purposes. This application is related to U.S. patent application Ser. No. 10/816,337, filed on Mar. 31, 2004, and entitled "Apparatuses and Methods for Cleaning a Substrate," and U.S. patent application Ser. No. 11/173,132, filed on Jun. 30, 2005, and entitled "System and Method for Producing Bubble Free Liquids for Nanometer Scale Semiconductor Processing," and U.S. patent application Ser. No. 11/153,957, filed on Jun. 15, 2005, and entitled "Method and Apparatus for Cleaning a Substrate Using Non-Newtonian Fluids," and U.S. patent application Ser. No. 11/154,129, filed on Jun. 15, 2005, and entitled "Method and Apparatus for Transporting a Substrate Using Non-Newtonian Fluid," and U.S. patent application Ser. No. 11/174,080, filed on Jun. 30, 2005, and entitled "Method for Removing Material from Semiconductor Wafer and Apparatus for Performing the Same," and U.S. patent application Ser. No. 10/746,114, filed on Dec. 23, 2003, and entitled "Method and Apparatus for Cleaning Semiconductor Wafers using Compressed and/or Pressurized Foams, Bubbles, and/or Liquids," and U.S. patent application Ser. No. 11/336,215 filed on Jan. 20, 2006, and entitled "Method and Apparatus for Removing Contamination from Substrate," U.S. patent application Ser. No. 11/346,894 filed on Feb. 3, 2006 and entitled "Method for Removing Contamination from a Substrate and for Making a Cleaning Solution," U.S. patent application Ser. No. 11/347,154 filed on Feb. 3, 2006 and entitled "Cleaning Compound and Method and System for Using the Cleaning Compound," U.S. patent application Ser. No. 11/532,491 filed on Sep. 15, 2006 and entitled "Method and material for cleaning a substrate," U.S. patent application Ser. No. 11/532,493 filed on Sep. 15, 2006 and entitled "Apparatus and system for cleaning a substrate." The disclosure of each of these related applications is incorporated herein by reference for all purposes.

BACKGROUND

In the fabrication of semiconductor devices, such as integrated circuits, memory cells, and the like, a series of manufacturing operations are performed to define features on semiconductor wafers. The wafers include integrated circuit devices in the form of multi-level structures defined on a silicon substrate. At a substrate level, transistor devices with diffusion regions are formed. In subsequent levels, interconnected metallization lines are patterned and electrically connected to the transistor devices to define a desired integrated circuit device. Also, patterned conductive layers are insulated from other conductive layers by dielectric materials.

During the series of manufacturing operations, the wafer surface is exposed to various types of contaminants. Essentially, any material present in a manufacturing operation is a potential source of contamination. For example, sources of contamination may include process gases, chemicals, deposition materials, and liquids, among others. The various contaminants may deposit on the surface of a wafer as particulate matter. If the particulate contamination is not removed, the devices within the vicinity of the contamination will likely be inoperable. Thus, it is necessary to clean contamination from the wafer surface in a substantially complete manner without damaging the features defined on the wafer. The size of particulate contamination is often on the order of critical dimension size of the features being fabricated on the wafer. Removal of such small particulate contamination without adversely affecting the features on the wafer can be a challenge.

Conventional wafer cleaning methods have relied heavily on mechanical force to remove particulate contamination from the wafer. As feature size continues to decrease and become more fragile, the probability of feature damage due to application of mechanical force to the wafer surface increases. For example, features having high aspect ratios are vulnerable to toppling or breaking when impacted by a sufficient mechanical force. To further complicate the cleaning problem, the move toward reduced feature sizes also causes a reduction in the size of particulate contamination that may cause damage. Particulate contamination of sufficiently small size can find its way into difficult-to-reach areas on the wafer surface, such as in a trench surrounded by high-aspect ratio features or bridging of conductive lines, etc. Thus, efficient and non-damaging removal of contaminants during marred and semiconductor fabrication represents continuous challenge to be met by continuing advances in wafer cleaning technology. It should be appreciated that the manufacturing operations for flat panel displays suffer from the same shortcomings of the integrated circuit manufacturing discussed above. Thus, any technology requiring contaminant removal is in need of a more effective and less-abrasive cleaning technique.

SUMMARY

Broadly speaking, the present invention fills these needs by providing an improved cleaning technique and cleaning solution. It should be appreciated that the present invention can be implemented in numerous ways, including as a system, an apparatus and a method. Several inventive embodiments of the present invention are described below.

In one embodiment, a method for cleaning a substrate is provided. The method initiates with applying an activation solution to a surface of the substrate. The activation solution and the surface of the substrate are contacted with a surface of a solid cleaning surface. The activation solution is absorbed into a portion of the solid cleaning element and then the substrate or the solid cleaning surface is moved relative to each other to clean the surface of the substrate.

In another embodiment, a cleaning apparatus for cleaning a substrate is provided. The cleaning apparatus includes a solid material having an outer surface, the outer surface configured to become softer relative to a remainder of the solid material when exposed to an activation solution disposed over a surface of the substrate. The cleaning apparatus includes a support structure configured to support the solid material and apply a force causing the outer surface to contact the surface of the substrate.

In yet another embodiment, a cleaning system for cleaning a substrate is provided. The cleaning system includes a support configured to support the substrate and a fluid delivery system configured to deliver an activation solution to a surface of the substrate. The cleaning system includes a solid phase cleaning element having an exposed surface, the exposed surface has a component that softens relative to a remaining portion of the solid phase cleaning element when the exposed surface interfaces with the activation solution. The cleaning system includes a support structure supporting the solid phase cleaning element. The support structure is configured to maintain the exposed surface against a surface of the substrate during a cleaning operation.

In still yet another embodiment a method for cleaning a substrate is provided. The method includes contacting a substrate surface with a surface of a solid cleaning element and forcing the solid cleaning element against the substrate surface. The method also includes moving one of the solid cleaning element or the substrate relative to each other, where the moving causes a plastic deformation of the surface of the solid cleaning element thereby depositing a layer of the solid cleaning element onto the substrate surface. The method further includes rinsing the layer of the solid cleaning element off of the substrate surface.

In another embodiment, a cleaning apparatus for cleaning a substrate is provided. The cleaning apparatus includes a solid material having an outer surface. The outer surface is configured to deform plastically to prevent damage to the substrate in response to a normal and/or a tangential force being applied to the solid material while one of the substrate or the solid material moves relative to each other. The cleaning apparatus includes a support structure configured to support the solid material and transfer the downward force.

Other aspects and advantages of the invention will become more apparent from the following detailed description, taken in conjunction with the accompanying drawings, illustrating by way of example the present invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

The embodiments described herein provide for a cleaning technique that reduces the abrasive contact and is efficient at cleaning contaminants from a semiconductor substrate which may contain high aspect ratio features. It should be appreciated that while the embodiments provide specific examples related to semiconductor cleaning applications, these cleaning applications may be extended to any technology requiring the removal of contaminants from a surface. The embodiments described herein move a single phase cleaning agent relative to a surface to be cleaned, where materials contained within the solid portion of the single phase cleaning agent provide lifting and removal of particles present on a wafer surface. In one exemplary embodiment, a solid cleaning element is used as the single phase cleaning agent where the cleaning element has a substantially planar surface that is brought in contact with a surface of the substrate to be cleaned. While specific embodiments refer to the element as a solid cleaning element, the solid cleaning element may be referred to as a puck, bar, etc. In one embodiment the solid cleaning element is composed of a fatty acid, however, other materials may be used just as effectively. These other materials may include polymers, alkyl sulfonate, alkyl phosphate, alkyl phosphonate, biopolymers, proteins, etc.

Figure 1A:
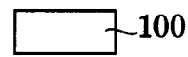
FIG. 1A is a simplified schematic diagram illustrating a high-level single phase cleaning operation in accordance with one embodiment of the invention.
Figure 1A:
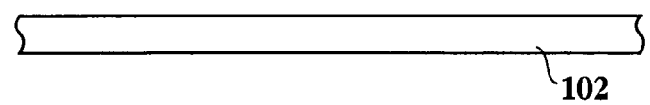

FIG. 1A is a simplified schematic diagram illustrating a high-level single phase cleaning operation in accordance with one embodiment of the invention. Solid cleaning element 100 is disposed over substrate 102. Solid cleaning element 100 is composed of a carbon chain and may be selected from commonly known fatty acids, such as, myristic acid, palmitic acid, stearic acid, etc. In one embodiment, the material for solid cleaning element 100 is a carbon chain having eight or more carbon atoms in the chain. It should be appreciated that with about ten or more carbon atoms, the chain will be a solid at room temperature. However, in an alternative embodiment, the solid cleaning element 100 may be composed of a carbon chain having less than eight carbons, and the solid cleaning element can be used in an environment lower than room temperature so that the composition is a solid. The mechanical properties of the solid cleaning element 100 are chosen such that the solid cleaning element has hardness less than the softest material on substrate 102. In one embodiment, the solid cleaning element 100 undergoes plastic deformation during contacting and relative motion between the solid cleaning element 100 and substrate 102.

Figure 1B:
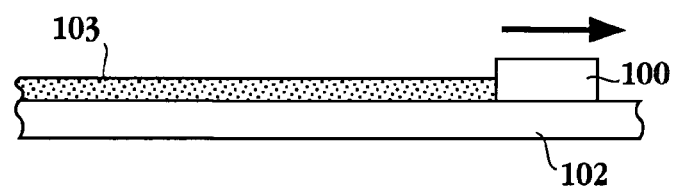
FIG. 1B is a simplified schematic diagram illustrating the plastic deformation of the solid cleaning element to deposit a layer on a substrate in accordance with one embodiment of the invention.

Thus, some material from the solid cleaning element 100 is rubbed off and deposited on substrate 102 as a coating layer 103 shown in FIG. 1B. In another embodiment, coating layer 103 is rinsed off of substrate 102 removing the coating layer and trapped contamination on substrate 102. As used herein, plastic deformation refers to the point at which the solid cleaning element can no longer retain its shape and may also be referred to as plastic strain or plastic flow. Plastic deformation typically occurs under shear stress, as opposed to brittle fractures which occur under normal stress. Thus, the downward force applied to solid cleaning element 100 along with the shear force from either the lateral transition of the solid cleaning element or movement of substrate 102 causes the plastic deformation of the bottom surface of solid cleaning element 100. Film 103 is then rinsed and removed. It should be appreciated that in one embodiment the solid cleaning element will interact with contaminants on the surface of substrate 102 and the contaminant are removed as thin film 103 is removed.

Figure 2A:
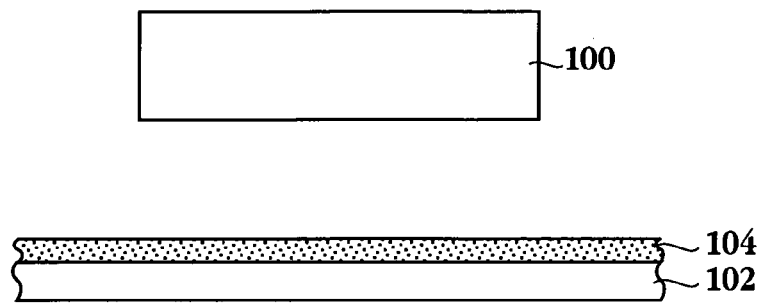
FIG. 2A is a simplified schematic diagram illustrating a side view of a cleaning apparatus utilizing the single phase element in accordance with one embodiment of the invention.

FIG. 2A is a simplified schematic diagram illustrating a high-level single phase cleaning operation in accordance with one embodiment of the invention. Solid cleaning element 100 is disposed over substrate 102. On a top surface of substrate 102 is an activation layer 104. Activation layer 104 is a thin aqueous layer with a basic additive in one embodiment. The basic additive may be selected from the group consisting of ammonium hydroxide, sodium hydroxide, sodium hydroxide, potassium hydroxide, triethanol amine, or tetramethylammonium hydroxide in one embodiment. It should be appreciated that the basic additive is not limited to these compounds, as any base may be used to combine with the aqueous layer. Solid cleaning element 100 is composed of a carbon chain and may be selected from commonly known fatty acids, such as, myristic acid, palmitic acid, stearic acid, or alkysulphonates or alkyphosphonates, etc. In one embodiment, the material for solid cleaning element 100 is a carbon chain having eight or more carbon atoms in the chain. It should be appreciated that with about ten or more carbon atoms, the chain will be a solid at room temperature. However, in an alternative embodiment, the solid cleaning element may be composed of a carbon chain having less than ten carbons, and the solid cleaning element can be used in an environment lower than room temperature so that the composition is a solid. One skilled in the art will appreciate that activation layer 104 may be disposed over a top surface of substrate 102 through any commonly known means available. For example, activation layer can be poured onto substrate 102, sprayed or other commonly available means.

In the embodiment where the element is a fatty acid, the following are exemplary compounds that may be used to compose the element. It should be appreciated that aliphatic acids represent essentially any acid defined by organic compounds in which carbon atoms form open chains. A fatty acid is an example of an aliphatic acid that can be used as the solid cleaning material as discussed above. Examples of fatty acids that may be used as the solid cleaning element include lauric, palmitic, stearic, oleic, linoleic, linolenic, arachidonic, gadoleic, eurcic, butyric, caproic, caprylic, myristic, margaric, behenic, lignoseric, myristoleic, palmitoleic, nervanic, parinaric, timnodonic, brassic, clupanodonic acid, lignoceric acid, cerotic acid, and mixtures thereof, among others. In one embodiment, the solid cleaning element can represent a mixture of fatty acids defined by various carbon chain lengths extending from C-1 to about C-26. Carboxylic acids are defined by essentially any organic acid that includes one or more carboxyl groups (COOH). When used as the solid cleaning element, the carboxylic acids can include mixtures of various carbon chain lengths extending from C-1 through about C-100. Also, the carboxylic acids can include other functional groups such as but not limited to methyl, vinyl, alkyne, amide, primary amine, secondary amine, tertiary amine, azo, nitrile, nitro, nitroso, pyridyl, peroxy, aldehyde, ketone, primary imine, secondary imine, ether, ester, halogen, isocyanate, isothiocyanate, phenyl, benzyl, phosphodiester, sulfhydryl.

Figure 2B:
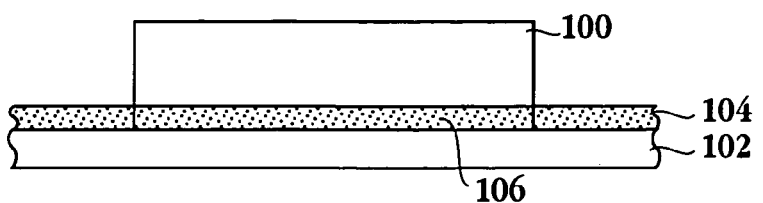
FIG. 2B is a simplified schematic diagram illustrating the lowering of the solid element to come into contact with the aqueous film and the substrate in accordance with one embodiment of the invention.

FIG. 2B is a simplified schematic diagram illustrating the lowering of the solid element to come into contact with the aqueous film and the substrate in accordance with one embodiment of the invention. Solid cleaning element 100 is lowered to contact activation layer 104 and a top surface of substrate 102. As a result of the contact between solid cleaning element 100 and activation layer 104, the portion of solid cleaning element in contact with activation layer becomes ionized if the pH of activation layer is near the pKa of solid cleaning element. Activation layer 104 is at a pH above the pKa of the fatty acid in one embodiment. With regard to stearic acid, the pKa is approximately 10.2. However, one skilled in the art will appreciate that the ionizing depends on the nature of the fatty acid. That is, the pKa changes with changes in the carbon chain length. Thus, for sulphonic acid and phosphonic acid, different pH's may be applied for activation layer 104, depending on the corresponding pKa. In another embodiment, activation layer imbibes and diffuses into solid cleaning element swelling and changing the mechanical properties of solid cleaning element in region 106 relative to the remainder of solid cleaning element 100. The dimensions of region 106 depend on the solid cleaning puck and activation layer material. Even though material properties of the solid cleaning element change near the surface, region 106 is still considered as being a solid and element 100 may be thought of as a single phase, i.e., solid where region 106 is softer relative to a remainder of element 100. In one embodiment, a portion of region 106 is rubbed off and deposited on substrate 102 as a coating layer as discussed with regard to layer 103 of FIG. 1B. In another embodiment, the coating layer is rinsed off substrate 102 removing the coating layer and any contamination on substrate 102. In an alternative embodiment, activation layer 104 may be a surfactant/dispersant. Here, the surfactant/dispersant will include ionic molecules. In one embodiment, a surfactant such as ammonium dodecyl sulphate (ADS) is employed. In the embodiment where a surfactant is used, any known nonionic, ionic or zwitterionic surfactant may be used. The activation of a portion of solid cleaning element 100 results in a cleaning surface which effectively cleans a surface of the substrate as described in co-pending application serial numbers.

Figure 3A:
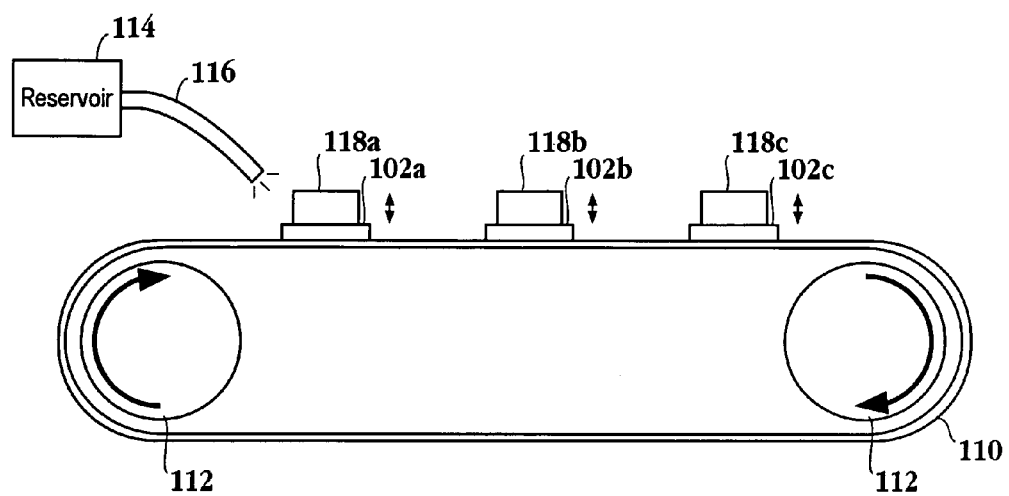
FIG. 3A is a simplified schematic diagram illustrating a side view of a cleaning apparatus utilizing the single phase element in accordance with one embodiment of the invention.

FIG. 3A is a simplified schematic diagram illustrating a side view of a cleaning apparatus utilizing the single phase element in accordance with one embodiment of the invention. Solid cleaning elements 118a-118c are illustrated as elongated bars in this embodiment. Conveyor 110, which functions as a transport mechanism for the substrates is driven via rollers 112 and will support substrates to be cleaned with solid cleaning elements 118a through 118c. Activation layer 104 of FIG. 2 is provided for each substrate through reservoir 114 and delivered via nozzle 116, although it is possible that the activation layer will not be applied. It should be appreciated that a nozzle and reservoir may correspond for each of solid cleaning elements 118a through 118c and is not shown for ease of illustration. In this manner, cleaning directed towards different applications can be applied to the substrates being cleaned. Solid cleaning elements 118a through 118c can be translated in a vertical direction relative to substrate surfaces. It should be appreciated that a gimbaled technique may be used to support each of solid cleaning elements 118a through 118c.

Figure 3B:
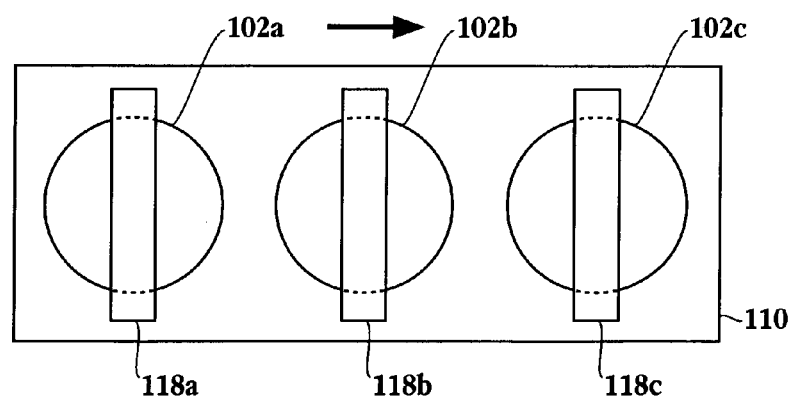
FIG. 3B is a top view of the cleaning apparatus of FIG. 3A in accordance with one embodiment of the invention.

FIG. 3B is a top view of the cleaning apparatus of FIG. 3A in accordance with one embodiment of the invention. As illustrated, transport mechanism 110 supports substrates 102a through 102c. In one embodiment, transport mechanism 110 is capable of clamping the substrate to support the substrate firmly and may also be capable of rotating the substrate. As each substrate is within a cleaning region of the corresponding element, i.e., the bottom surface of the bar is able to contact a top surface of the substrate, the element is lowered to contact the substrate. The activation layer has been applied to the substrate prior to contact, in order to clean the corresponding substrate. Thus, substrates 102a through 102c are cleaned as they traverse the path by the corresponding solid cleaning element 118a through 118c. The relative rate at which conveyor 110 moves is sufficient to allow the necessary residence time for each solid cleaning elements with corresponding substrate 102a through 102c. In one embodiment, the composition of each solid cleaning element, may be different. That is, different fatty acids or other non-fatty acid material, and/or different activation agents may be used to provide sequential targeted cleaning. For example, a first element may target a certain type of contaminant, while the other elements can target other types of contaminants.

Figure 4:
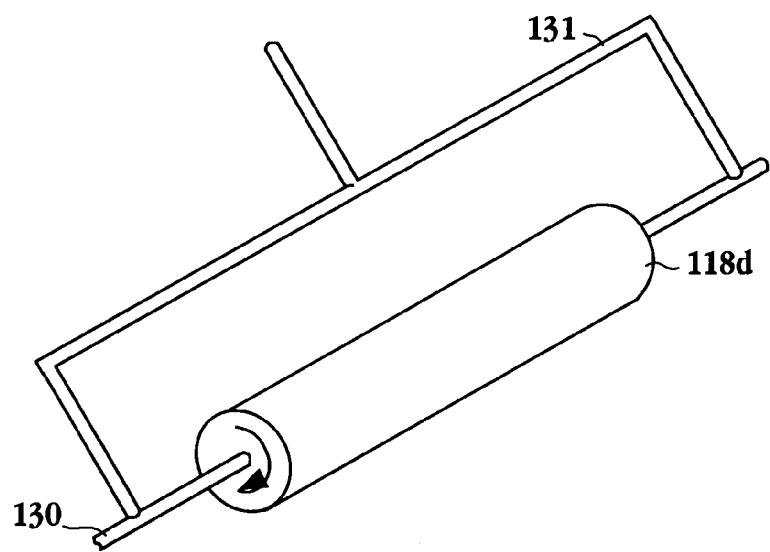
FIG. 4 is a simplified schematic diagram of an alternative embodiment for the single phase cleaning solid in accordance with one embodiment of the invention.

FIG. 4 is a simplified schematic diagram of an alternative embodiment for the single phase cleaning solid in accordance with one embodiment of the invention. Here, rather than a puck or a bar, the single phase cleaning solid is a roller. The roller will rotate around axis 130. It should be appreciated that roller 118d may be applied to any of the embodiments described herein. In one embodiment, support structure 131 may be used to force a surface of roller 118d against a wafer surface. For example, a shaft may traverse through roller 118d along axis 130. One skilled in the art will appreciate that support structure 131 may be held at different angles relative to a planar surface of a wafer being cleaned. In addition, support structure 131 may be coupled to roller 118d through known techniques that allows for free rotation of roller 118d and accommodates the angular movement mentioned above.

Figure 5A:
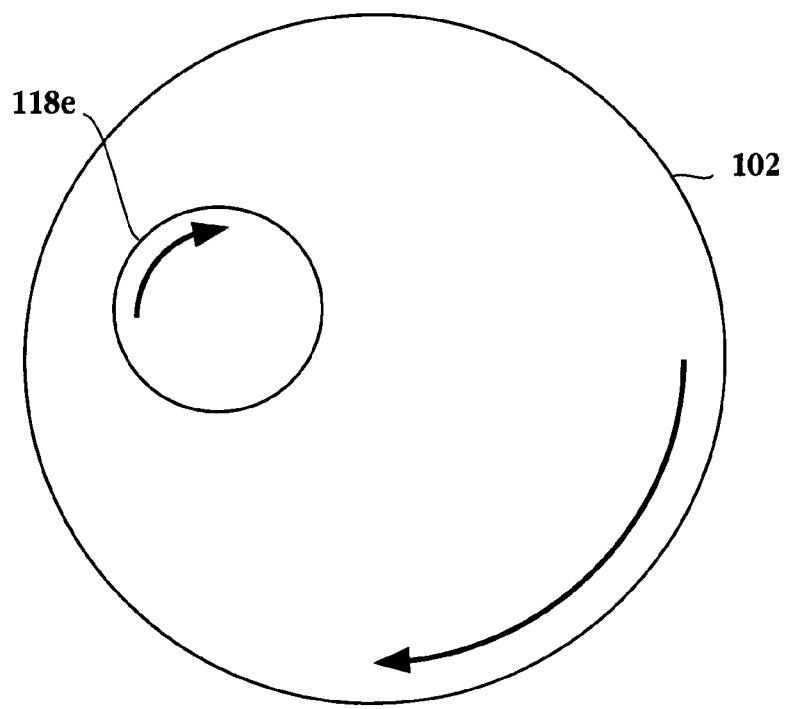
FIG. 5A is another alternative embodiment where solid cleaning element is illustrated as a disc, in accordance with one embodiment of the invention.

FIG. 5A is another alternative embodiment where solid cleaning element is illustrated as a disc. Disc 118e rotates relative to the rotation of substrate 102 in order to clean the surface of substrate 102. It should be appreciated that disc 118e may be various diameters relative to the substrate 102 being cleaned and the relative diameters are exemplary illustrations not meant to be limiting. One skilled in the art will appreciate that substrate 102 and disc 118e may rotate in similar directions, or disc 118e and substrate 102 may rotate in opposite directions. As mentioned above, a gimbaled support structure may be incorporated with element 118e.

Figure 5B:
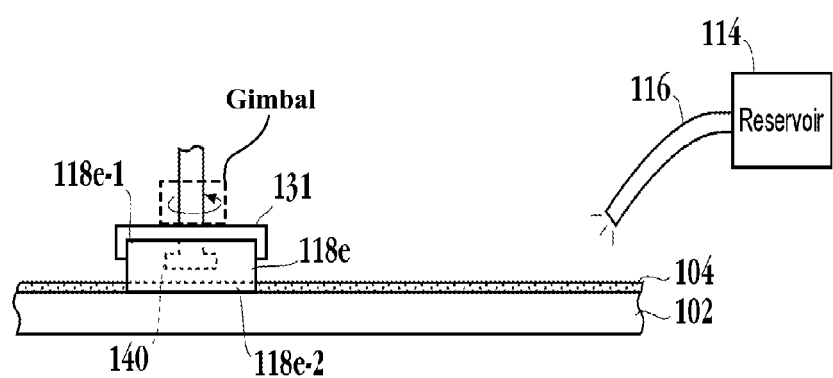
FIG. 5B is a simplified schematic diagram illustrating a side view of a element embodiment of the single phase cleaning element in accordance with one embodiment of the invention.

FIG. 5B is a simplified schematic diagram illustrating a side view of a element embodiment of the single phase cleaning element in accordance with one embodiment of the invention. Element 118e is affixed to support structure 131. Element 118e may be affixed to support structure 131 through adhesive or mechanical means where the support structure is structurally integrated with the element through known means. In one exemplary embodiment, element 118e is defined around support 140 to provide the structural support. In this embodiment, element 118e can be thought of as being molded around support 140. Support structure 131 provides rotational support of element 118e. Of course, support 131 may be gimbaled as discussed above. Reservoir 114 provides activation fluid through delivery line 116 to form activation layer 104 on a top surface of wafer 102. As mentioned above, the activation layer is applied prior to contacting of element 118e with the surface to be cleaned. The substrate and cleaning element in contact with the activation layer ionizes preventing adsorption of solid cleaning element to substrate. Element 118e and/or wafer 102 are rotated to perform the cleaning operation. It should be appreciated that element 118e remains as a solid however, the physical properties, i.e., the hardness of the top portion 118e-1 relative to the hardness of the bottom portion 118e-2 is altered by the activation layer 104 at the bottom surface of element 118e. One skilled in the art will appreciate that unlike a porous brush, which has holes/cavities, the embodiments described herein provide a solid surface that does not have the holes/cavities of a typical brush applied to clean the surface of wafer 102. Thus, the embodiments described herein provide a contiguous uninterrupted cleaning layer that may conform to the surface of wafer 102. Furthermore, the activation of bottom portion 118e-1 provides a softer interface in which pressure exerted on top portion 118e-2 is translated to provide the cleansing action.

Figure 6:
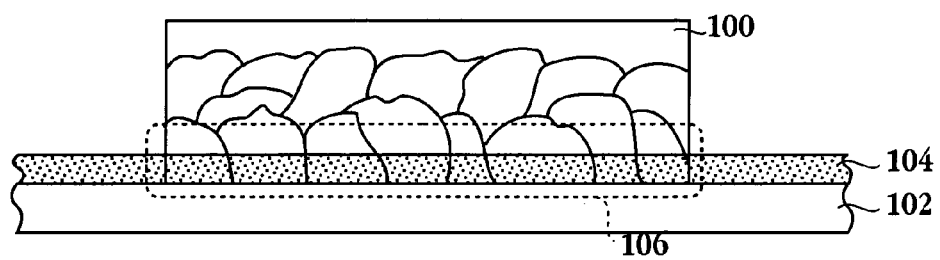
FIG. 6 is a simplified schematic diagram illustrating further details on the activation layer for the single phase cleaning apparatus in accordance with one embodiment of the invention.
Figure 7:
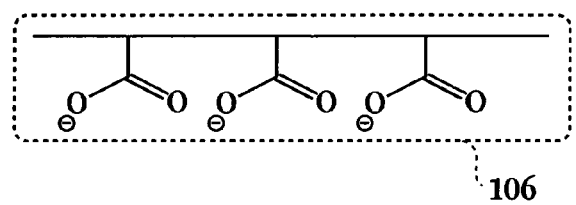
FIG. 7, illustrates a more detailed schematic diagram of the ionization of region of FIG. 5 in accordance with one embodiment of the invention.

FIG. 6 is a simplified schematic diagram illustrating further details on the activation layer for the single phase cleaning apparatus in accordance with one embodiment of the invention. Substrate 102 has activation layer 104 disposed thereon, and as solid cleaning element 100 is brought into contact with activation layer 104, water imbibes into solid cleaning element 100. The water penetrates into the grain structure of the solid cleaning element 100 as illustrated in region 106. As mentioned, activation layer 104 is an aqueous layer in one embodiment where the pH of the aqueous layer is basic in order to ionize and neutralize the fatty acid in region 106. In essence, the penetration of the activation layer into region 106 alters the properties of solid cleaning element 100 in that region. For example, in region 106 solid cleaning element 100 may become gelatinous in nature but still in solid phase. Referring to FIG. 7, the ionization of region 106 is illustrated. Here, with regard to stearic acid, the hydrogen atoms of the carboxylic acid groups dissociate resulting in a negative charged functional group at this interface in region 106. It should be appreciated that by ionizing or dissociating these functional groups, absorption to a negatively charged interface will be prevented. That is, the solid cleaning element will not adhere to the wafer surface thereby ensuring efficient cleaning is achieved. It should be appreciated that where the activation layer is a surfactant/dispersant, the effect described above with regard to FIG. 6 is achieved. In one embodiment, the activation layer has chemical additives to enhance contamination removal. These chemical additives include hydrofluoric acid, sulfuric acid, hydrochloric acid, tetramethyl ammonium hydroxide, hydrogen peroxide, among others.

Figure 8:
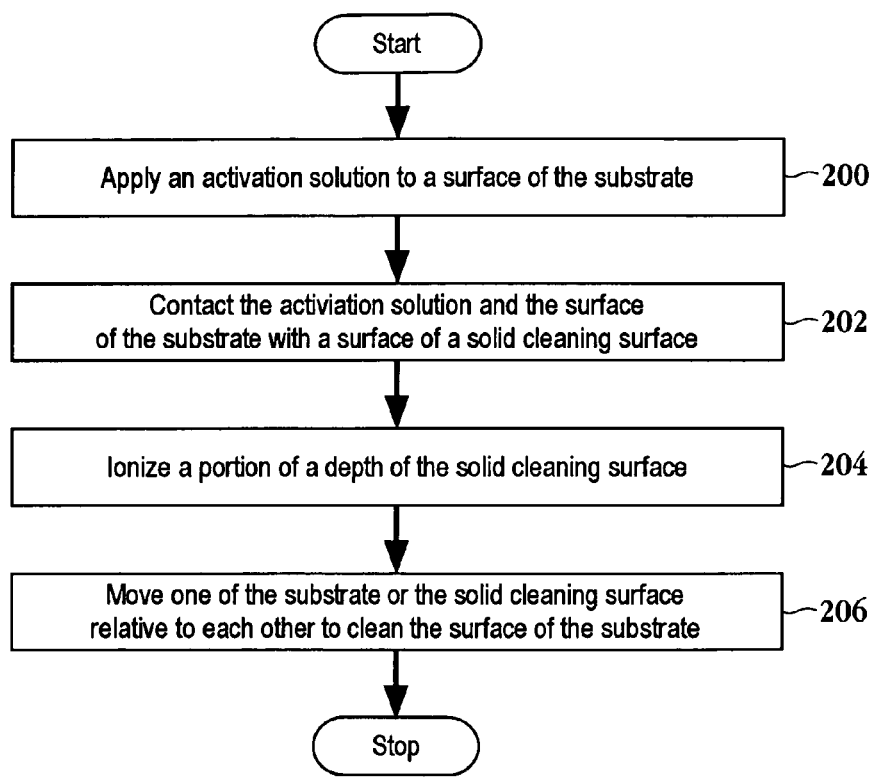
FIG. 8 is a flow chart diagram illustrating the method operations for cleaning a substrate having surface contaminants in accordance with one embodiment of the invention.

FIG. 8 is a flow chart diagram illustrating the method operations for cleaning a substrate having surface contaminants in accordance with one embodiment of the invention. The method initiates with operation 200 where an activation solution is applied to the surface of the substrate through operation can proceed without application of the activation surface. As mentioned above, the activation solution may be an aqueous solution which has a pH that is greater than a pKa of a cleaning apparatus. Alternatively, the activation solution may be a surfactant. It should be appreciated that the activation solution may be poured onto the substrate or sprayed or any other means currently available. The method then advances to operation 202 where a solid cleaning surface is brought into contact with the activation solution and the surface of the substrate. Bringing the solid cleaning surface into contact with the activation solution, results in activating or ionizing/neutralizing a portion of the solid cleaning surface as illustrated with reference to FIGS. 6 and 7 and as specified in operation 204. This ionization/neutralization or activation prevents absorption to ensure that the solid cleaning element will not leave behind any residue. In one embodiment, where a surfactant is used as the activation layer, then the surfactant prevents absorption to ensure that the solid cleaning element will not leave behind any residue. For an embodiment where the cleaning element is a disk, such as in FIGS. 5A and 5B, one exemplary configuration of the element may be a disk with dimensions of 5 inches in diameter and a height or depth of one inch. Here, the portion of the 1 inch depth is about ⅛ of an inch. Of course, this is an exemplary configuration and the actual dimensions may vary depending on the composition of the element and whether a disk, roller, etc. is used as the solid cleaning element, as well as other environmental variables. In one embodiment, the activation solution is absorbed into a portion of the solid cleaning element as described with reference to FIGS. 5 and 6.

The method of FIG. 8 advances to operation 206 where the substrate and/or the solid cleaning surface is moved relative to each other to clean the surface of the substrate. As described in the figures above, the solid cleaning surface may rotate, roll, slide, etc., relative to the surface of the substrate to be cleaned. The solid cleaning surface can be a disc, bar, puck, roller, or any other suitable apparatus for applying the functionality described herein to the surface of the wafer for cleaning. In essence, any geometric shape that may leave a layer on the surface of the substrate through plastic deformation or any geometric shape that may interact with the activation layer to remove surface contaminants may be employed with the embodiments described herein. In addition, the support structure provided for the solid cleaning surface may include a gimbaled structure to allow rotation of the solid cleaning surface in multiple dimensions, such as a two axis gimbal. As is known, a gimbal is typically made up of two or three pairs of pivots mounted on axes at right angles.

Although the present invention has been described in the context of removing contaminants from a semiconductor wafer, it should be understood that the previously described principles and techniques of the present invention can be equally applied to cleaning surfaces other than semiconductor wafers. For example, the present invention can be used to clean any equipment surface used in semiconductor manufacturing, wherein any equipment surface refers to any surface that is in environmental communication with the wafer, e.g., shares air space with the wafer. The present invention can also be used in other technology areas where contamination removal is important. For example, the present invention can be used to remove contamination on parts used in the space program, or other high technology areas such as surface science, energy, optics, microelectronics, MEMS, flat-panel processing, solar cells, memory devices, etc. It should be understood that the aforementioned listing of exemplary areas where the present invention may be used is not intended to represent an inclusive listing. Furthermore, it should be appreciated that the wafer as used in the exemplary description herein can be generalized to represent essentially any other structure, such as a substrate, a part, a panel, etc.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention. In the claims, elements and/or steps do not imply any particular order of operation, unless explicitly stated in the claims.

What is claimed is:

1. A cleaning system for a semiconductor substrate, comprising:
   a support configured to support the semiconductor substrate;
   an activation solution;
   a fluid delivery system configured to deliver the activation solution to a surface of the semiconductor substrate;
   a solid phase cleaning element defined as a bar having a grain structure and an exposed surface that is disposed facing the support, the exposed surface having a component that softens relative to a remaining portion of the solid phase cleaning element when the exposed surface interfaces with the activation solution, and wherein the component that softens is ionized by the activation solution to provide negatively charged functional groups at the exposed surface; and
   a support structure for holding the solid phase cleaning element from a holding side that is opposite the exposed surface, the support structure having a gimbal interfaced with the holding side, wherein the exposed surface is defined to be disposed against the surface of the semiconductor substrate, the support structure providing for vertical force and lateral force to the solid phase cleaning element.

2. The cleaning system of claim 1, wherein the solid phase cleaning element consists essentially of a fatty acid.

3. The cleaning system of claim 1, wherein the solid phase cleaning element is a material selected from a group consisting of an alkyl sulfonate, an alky, phosphate, and an alkyl phosphonate.

4. The cleaning system of claim 1, wherein a pH of the activation solution is above 7.0.

5. The cleaning system of claim 1, wherein the activation solution is a surfactant.

6. The cleaning system of claim 5, wherein the surfactant is ammonium dodecyl sulphate.

7. The cleaning system of claim 1, wherein the support structure is configured to rotate the solid phase cleaning element.

8. The cleaning system of claim 1, wherein the support structure is configured to translate the solid phase cleaning element parallel to and perpendicular to the surface of the substrate.

9. The cleaning system of claim 1, wherein the support structure holds the solid phase cleaning element stationary.

10. The cleaning system of claim 1, wherein the activation solution reacts with the exposed surface to develop a gelatinous interface portion of the solid phase cleaning element against the surface of the substrate.

11. The cleaning system of claim 10, wherein the gelatinous interface portion captures particles disposed on the surface of the substrate.

12. The cleaning system of claim 1, further comprising;
   a plurality of solid phase cleaning elements, the plurality of solid phase cleaning elements each composed of a different material, wherein the substrate support moves the substrate under each of the plurality of solid phase cleaning elements, and wherein the fluid delivery system provides the activation solution to the substrate prior to the substrate moving under each of the plurality of solid phase cleaning elements.

13. A system for processing a semiconductor substrate, comprising:
   a support configured to support the semiconductor substrate;
   a fluid delivery system configured to deliver an activation solution to a surface of the semiconductor substrate;

a solid phase cleaning element defined as an elongated bar, the solid phase cleaning element having a grain structure and a plastic deformation property, the solid phase cleaning element having an exposed surface that is disposed facing the support, the exposed surface having a component that softens relative to a remaining portion of the solid phase cleaning element when the exposed surface interfaces with the activation solution; and a support structure for holding the solid phase cleaning element from a holding side that is opposite the exposed surface, the support structure having a gimbal interfacing the holding side, wherein the exposed surface is movable against the surface of the semiconductor substrate, the support structure providing a vertical force and a lateral force to the solid phase cleaning element when the exposed surface is in contact with the surface of the semiconductor substrate, the solid phase cleaning element at least partially deforming over the surface of the substrate using its plastic deformation property during the application of one of the vertical force or lateral force, the vertical force being perpendicular to the semiconductor substrate surface.

* * * * *